United States Patent
Li et al.

(10) Patent No.: US 12,199,088 B2
(45) Date of Patent: Jan. 14, 2025

(54) PACKAGE STRUCTURES

(71) Applicant: Ancora Semiconductors Inc., Taoyuan (TW)

(72) Inventors: Jen-Chih Li, Taoyuan (TW); Liang-Cheng Wang, Taoyuan (TW); Wei-Hsiang Chao, Taoyuan (TW)

(73) Assignee: ANCORA SEMICONDUCTORS INC., Taoyuan (TW)

( * ) Notice: Subject to any disclaimer, the term of this patent is extended or adjusted under 35 U.S.C. 154(b) by 389 days.

(21) Appl. No.: 17/718,534

(22) Filed: Apr. 12, 2022

(65) Prior Publication Data
US 2023/0326918 A1    Oct. 12, 2023

(51) Int. Cl.
*H01L 27/02*    (2006.01)
*H01L 23/00*    (2006.01)
*H01L 23/495*   (2006.01)
*H01L 29/20*    (2006.01)

(52) U.S. Cl.
CPC .... *H01L 27/0255* (2013.01); *H01L 23/49562* (2013.01); *H01L 24/48* (2013.01); *H01L 29/2003* (2013.01); *H01L 2224/48137* (2013.01); *H01L 2224/48245* (2013.01)

(58) Field of Classification Search
CPC ........... H01L 27/0255; H01L 23/49562; H01L 24/48; H01L 29/2003; H01L 2224/48137; H01L 2224/48245; H01L 23/4952; H01L 23/60; H01L 24/49; H01L 23/49503; H01L 23/31; H01L 23/49541
See application file for complete search history.

(56) References Cited

U.S. PATENT DOCUMENTS

| | | | |
|---|---|---|---|
| 5,715,127 A * | 2/1998 | Yu | H01L 23/60 361/111 |
| 9,536,803 B2 * | 1/2017 | Sheridan | H01L 27/088 |
| 11,444,078 B2 * | 9/2022 | Ueki | H01F 27/402 |
| 2017/0236790 A1 * | 8/2017 | Chinnusamy | H01L 21/4853 438/126 |

FOREIGN PATENT DOCUMENTS

TW    202211391 A    3/2022

OTHER PUBLICATIONS

Taiwanese Office Action and Search Report corresponding to TW application No. 111120578 dated Apr. 26, 2023; pp. 1-4.

* cited by examiner

*Primary Examiner* — Mohammed Shamsuzzaman
(74) *Attorney, Agent, or Firm* — MUNCY, GEISSLER, OLDS & LOWE, P.C.

(57) ABSTRACT

A package structure is provided. The package structure includes a leadframe, a GaN power device, and an electrostatic discharge protection component. The leadframe includes a gate pad, a source pad, and a drain pad, which are disposed on the leadframe. The GaN power device has a gate end. The GaN power device is disposed on the source pad of the leadframe. The electrostatic discharge protection component includes a first pad. The first pad is disposed on the electrostatic discharge protection component. The electrostatic discharge protection component is disposed on the source pad of the leadframe. The gate end of the GaN power device is electrically connected to the first pad of the electrostatic discharge protection component. The first pad of the electrostatic discharge protection component is electrically connected to the gate pad of the leadframe.

6 Claims, 7 Drawing Sheets

PACKAGE STRUCTURES

TECHNICAL FIELD

The present invention relates to a package structure, and more particularly to a package structure with an electrostatic discharge protection component in a specific connection manner.

BACKGROUND

When an abnormal ESD pulse occurs, if no electrostatic discharge protection component is used, the ESD pulse will directly damage the internal chip, resulting in an open circuit or failure to work normally.

However, due to the large parasitic capacitance of the electrostatic discharge protection components (such as Zener diodes), it is easy to cause the parasitic inductance to be too large in the wire-bonding package. Excessive parasitic inductance can easily cause high-frequency oscillation under high-frequency current operation, which will cause abnormal switching of gallium-nitride power devices, thereby causing incorrect execution of the system and harming the electronic equipment.

SUMMARY

In accordance with one embodiment of the present invention, a package structure is provided. The package structure includes a leadframe, a GaN power device, and an electrostatic discharge protection component. The leadframe includes a gate pad, a source pad, and a drain pad, which are disposed on the leadframe. The GaN power device has a gate end. The GaN power device is disposed on the source pad of the leadframe. The electrostatic discharge protection component includes a first pad. The first pad is disposed on the electrostatic discharge protection component. The electrostatic discharge protection component is disposed on the source pad of the leadframe. The gate end of the GaN power device is electrically connected to the first pad of the electrostatic discharge protection component. The first pad of the electrostatic discharge protection component is electrically connected to the gate pad of the leadframe.

In some embodiments, the gate end of the GaN power device is electrically connected to the first pad of the electrostatic discharge protection component by a first conductive wire. The first pad of the electrostatic discharge protection component is electrically connected to the gate pad of the leadframe by a second conductive wire.

In some embodiments, the electrostatic discharge protection component further includes a second pad, and the first pad and the second pad are disposed on the same surface of the electrostatic discharge protection component. The second pad of the electrostatic discharge protection component is electrically connected to the source pad of the leadframe by a third conductive wire.

In some embodiments, the capacitance value of the electrostatic discharge protection component is greater than or equal to 30 nC. The operating voltage of the electrostatic discharge protection component is greater than or equal to 6V.

In some embodiments, the electrostatic discharge protection component includes a Zener diode, or a transient voltage suppressor (TVS) diode.

In accordance with one embodiment of the present invention, a package structure is provided. The package structure includes a leadframe, a GaN power device, and an electrostatic discharge protection component. The leadframe includes a gate pad, a source pad, and a drain pad, which are disposed on the leadframe. The GaN power device has a gate end. The GaN power device is disposed on the source pad of the leadframe. The electrostatic discharge protection component includes a first pad. The first pad is disposed on the electrostatic discharge protection component. The electrostatic discharge protection component is disposed on the source pad of the leadframe. The gate end of the GaN power device is electrically connected to the gate pad of the leadframe. The first pad of the electrostatic discharge protection component is electrically connected to the gate pad of the leadframe by a plurality of conductive wires.

In some embodiments, the gate end of the GaN power device is electrically connected to the gate pad of the leadframe by a conductive wire. The first pad of the electrostatic discharge protection component is electrically connected to the gate pad of the leadframe by two conductive wires.

In some embodiments, the electrostatic discharge protection component further includes a second pad, wherein the first pad and the second pad are disposed on the same surface of the electrostatic discharge protection component. The second pad of the electrostatic discharge protection component is electrically connected to the source pad of the leadframe by a conductive wire.

In the present invention, the connection manner for the wire-bonding from the gate end of the GaN power device to the electrostatic discharge protection component and from the electrostatic discharge protection component to the gate pad of the leadframe can greatly reduce the inductance in the wire-bonding loop and suppress the high-frequency oscillation of the system. Also, in another connection manner, for example, the wire-bonding from the gate end of the GaN power device to the gate pad of the leadframe and from the electrostatic discharge protection component to the gate pad of the leadframe by a plurality of conductive wires, which can effectively reduce the parasitic inductance caused by the wire-bonding by 20-40% and suppress the high-frequency oscillation of the system. Therefore, the disclosed package structure with the electrostatic discharge protection component in the specific connection manners can not only greatly reduce parasitic inductance, but also resist electrostatic discharge (ESD) pulse, so that the electronic device can operate normally, and its reliability can be improved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is determined by reference to the appended claims.

In order to suppress the phenomenon of high-frequency oscillation in the package structure, the present invention provides a package structure with an electrostatic discharge protection component in a specific connection manner. Therefore, the package structure can not only greatly reduce parasitic inductance, but also resist electrostatic discharge (ESD) pulse, so that the electronic device can operate normally, and its reliability can be improved.

Figure 1A:
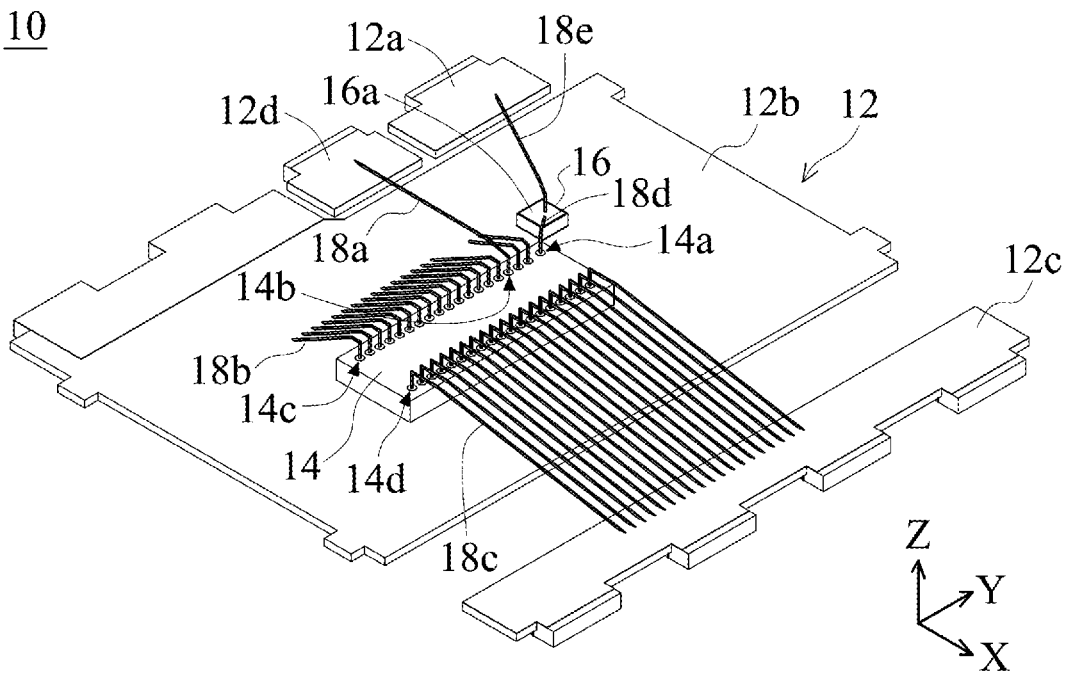
FIG. 1A is a stereoscopic view of a package structure in accordance with one embodiment of the present invention.
Figure 1B:
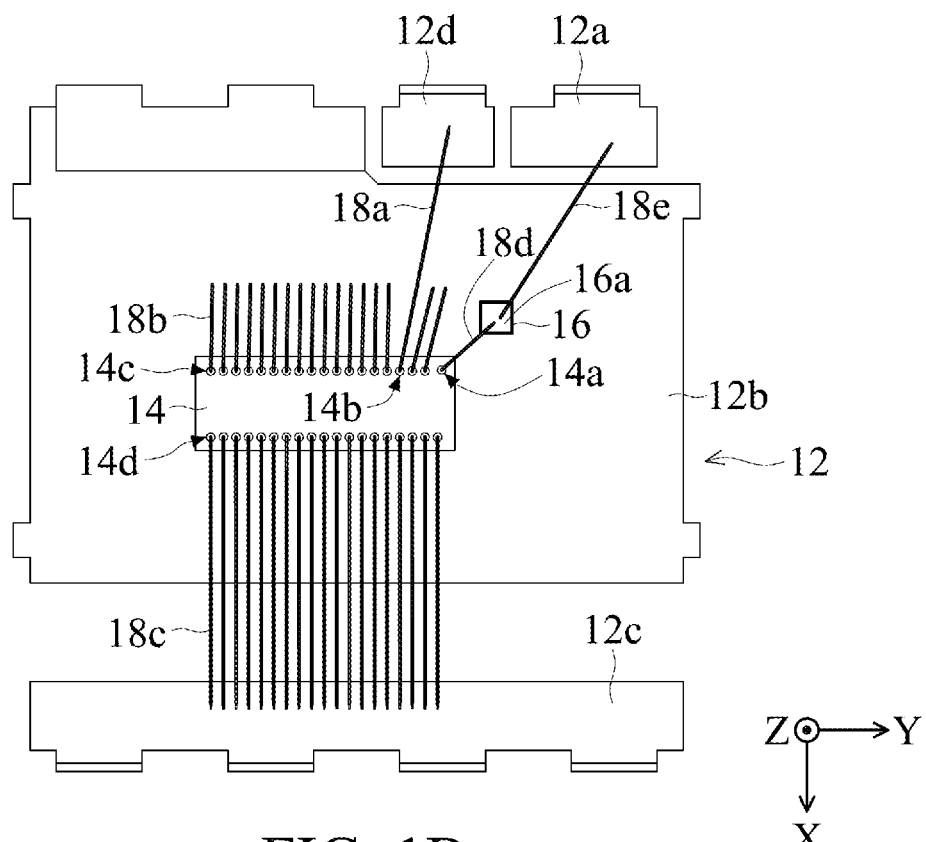
FIG. 1B is a top view of a package structure in accordance with one embodiment of the present invention.

Referring to FIGS. 1A and 1B, in accordance with one embodiment of the present invention, a package structure 10 is provided. FIG. 1A is a stereoscopic view of the package structure 10. FIG. 1B is a top view of the package structure 10.

As shown in FIGS. 1A and 1B, the package structure 10 includes a leadframe 12, a gallium nitride (GaN) power device 14 and an electrostatic discharge protection component 16. The leadframe 12 includes a gate pad 12a, a source pad 12b, a drain pad 12c and a Kelvin source pad 12d, which are disposed on the leadframe 12. The GaN power device 14 has a gate end 14a, a first source end 14b, a second source end 14c and a drain end 14d. The GaN power device 14 is disposed on the source pad 12b of the leadframe 12. The electrostatic discharge protection component 16 includes a first pad 16a disposed on it. The electrostatic discharge protection component 16 is disposed on the source pad 12b of the leadframe 12. The first source end 14b of the GaN power device 14 is electrically connected to the Kelvin source pad 12d of the leadframe 12. The second source end 14c of the GaN power device 14 is electrically connected to the source pad 12b of the leadframe 12. The drain end 14d of the GaN power device 14 is electrically connected to the drain pad 12c of the leadframe 12. Specifically, the gate end 14a of the GaN power device 14 is electrically connected to the first pad 16a of the electrostatic discharge protection component 16. The first pad 16a of the electrostatic discharge protection component 16 is electrically connected to the gate pad 12a of the leadframe 12. In FIGS. 1A and 1B for example, the first source end 14b of the GaN power device 14 is electrically connected to the Kelvin source pad 12d of the leadframe 12 by a conductive wire 18a. The second source end 14c of the GaN power device 14 is electrically connected to the source pad 12b of the leadframe 12 by a conductive wire 18b. The drain end 14d of the GaN power device 14 is electrically connected to the drain pad 12c of the leadframe 12 by a conductive wire 18c. The gate end 14a of the GaN power device 14 is electrically connected to the first pad 16a of the electrostatic discharge protection component 16 by a conductive wire 18d. The first pad 16a of the electrostatic discharge protection component 16 is electrically connected to the gate pad 12a of the leadframe 12 by a conductive wire 18e.

In some embodiments, the leadframe 12 is made of metal, such as copper or other appropriate metal materials. In some embodiments, the gate pad 12a, the source pad 12b, the drain pad 12c and the Kelvin source pad 12d are made of metal, such as silver or other appropriate metal materials.

In FIGS. 1A and 1B, the electrostatic discharge protection component 16 is a vertical component. In some embodiments, the capacitance value of the electrostatic discharge protection component 16 is greater than or equal to about 30 nC. In some embodiments, the operating voltage of the electrostatic discharge protection component 16 is greater than about or equal to 6V. In some embodiments, the electrostatic discharge protection component 16 includes a Zener diode, or a transient voltage suppressor (TVS) diode.

Figure 2A:
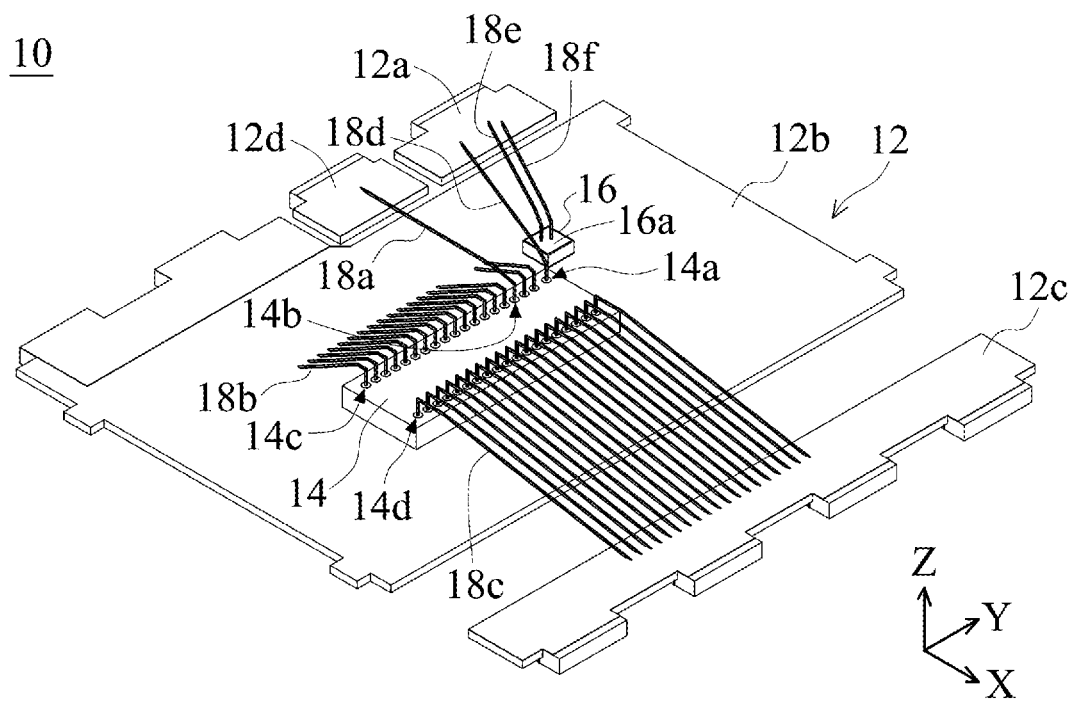
FIG. 2A is a stereoscopic view of a package structure in accordance with one embodiment of the present invention.
Figure 2B:
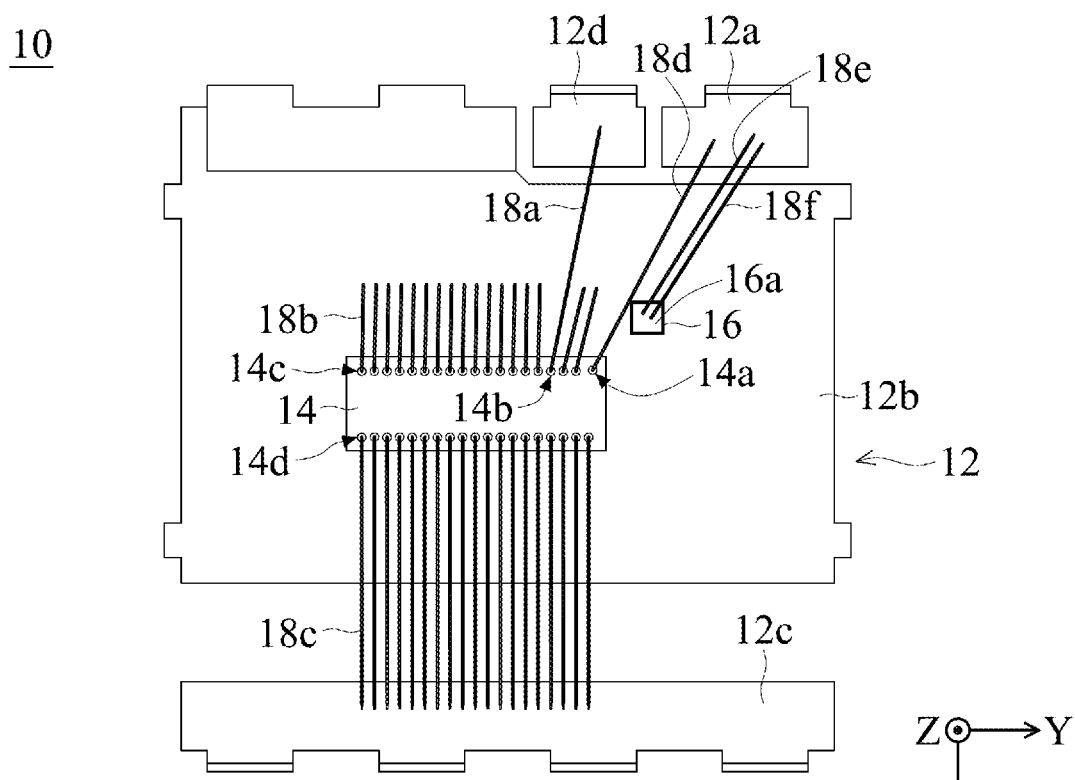
FIG. 2B is a top view of a package structure in accordance with one embodiment of the present invention.

Referring to FIGS. 2A and 2B, in accordance with one embodiment of the present invention, a package structure 10 is provided. FIG. 2A is a stereoscopic view of the package structure 10. FIG. 2B is a top view of the package structure 10.

As shown in FIGS. 2A and 2B, the package structure 10 includes a leadframe 12, a gallium nitride (GaN) power device 14 and an electrostatic discharge protection component 16. The leadframe 12 includes a gate pad 12a, a source pad 12b, a drain pad 12c and a Kelvin source pad 12d disposed on it. The GaN power device 14 has a gate end 14a, a first source end 14b, a second source end 14c and a drain end 14d. The GaN power device 14 is disposed on the source pad 12b of the leadframe 12. The electrostatic discharge protection component 16 includes a first pad 16a disposed on it. The electrostatic discharge protection component 16 is disposed on the source pad 12b of the leadframe 12. The first source end 14b of the GaN power device 14 is electrically connected to the Kelvin source pad 12d of the leadframe 12. The second source end 14c of the GaN power device 14 is electrically connected to the source pad 12b of the leadframe 12. The drain end 14d of the GaN power device 14 is electrically connected to the drain pad 12c of the leadframe 12. Specifically, the gate end 14a of the GaN power device 14 is electrically connected to the gate pad 12a of the leadframe 12. The first pad 16a of the electrostatic discharge protection component 16 is electrically connected to the gate pad 12a of the leadframe 12 by a plurality of conductive wires. In FIGS. 2A and 2B, for example, the first source end 14b of the GaN power device 14 is electrically connected to the Kelvin source pad 12d of the leadframe 12 by a conductive wire 18a. The second source end 14c of the GaN power device 14 is electrically connected to the source pad 12b of the leadframe 12 by a conductive wire 18b. The drain end 14d of the GaN power device 14 is electrically connected to the drain pad 12c of the leadframe 12 by a conductive wire 18c. The gate end 14a of the GaN power device 14 is electrically connected to the gate pad 12a of the leadframe 12 by a conductive wire 18d. The first pad 16a of the electrostatic discharge protection component 16 is electrically connected to the gate pad 12a of the leadframe 12 by two conductive wires (18e and 18f). In some embodiments, the first pad 16a of the electrostatic discharge protection component 16 is electrically connected to the gate pad 12a of the leadframe 12 by other appropriate number of conductive wires, for example, two or more.

In some embodiments, the leadframe 12 is made of metal, such as copper or other appropriate metal materials. In some embodiments, the gate pad 12a, the source pad 12b, the drain pad 12c and the Kelvin source pad 12d are made of metal, such as silver or other appropriate metal materials.

In FIGS. 2A and 2B, the electrostatic discharge protection component 16 is a vertical component. In some embodiments, the capacitance value of the electrostatic discharge protection component 16 is greater than or equal to about 30 nC. In some embodiments, the operating voltage of the electrostatic discharge protection component 16 is greater than or equal to 6V. In some embodiments, the electrostatic discharge protection component 16 includes a Zener diode, or a transient voltage suppressor (TVS) diode.

Figure 3A:
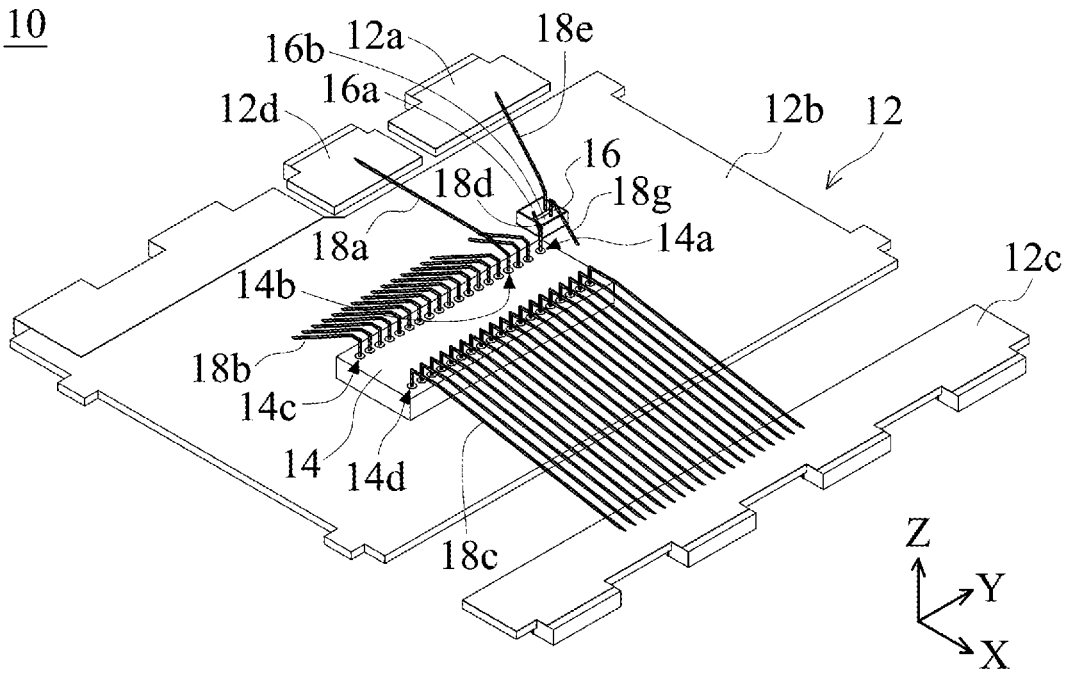
FIG. 3A is a stereoscopic view of a package structure in accordance with one embodiment of the invention.
Figure 3B:
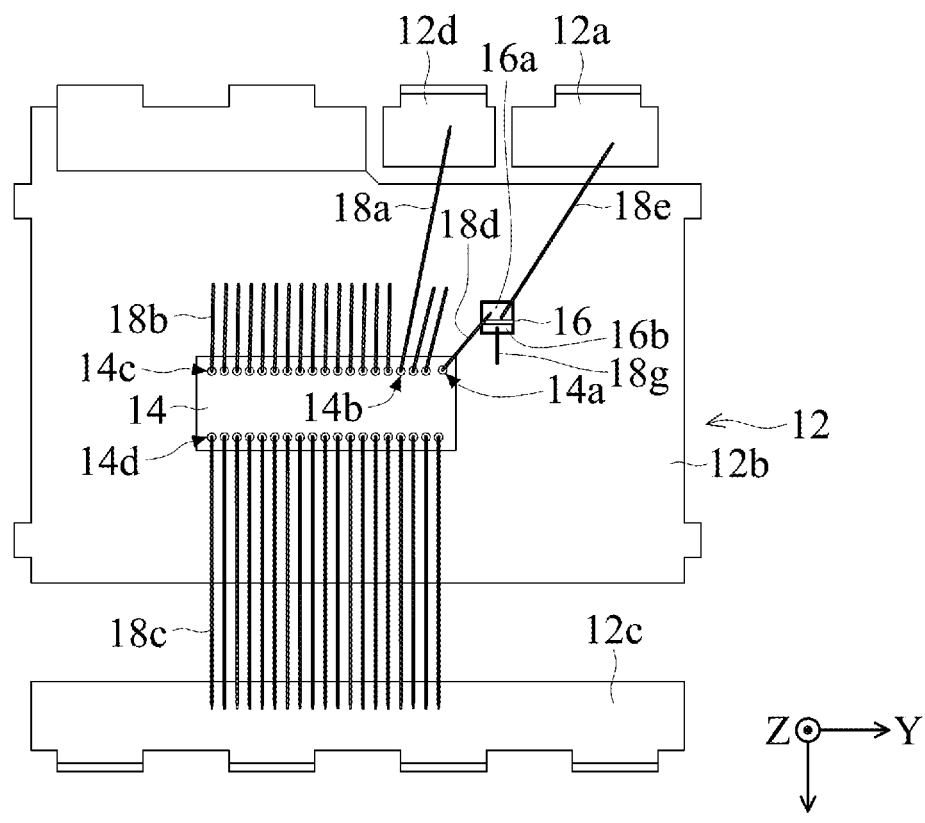
FIG. 3B is a top view of a package structure in accordance with one embodiment of the present invention.

Referring to FIGS. 3A and 3B, in accordance with one embodiment of the present invention, a package structure 10 is provided. FIG. 3A is a stereoscopic view of the package structure 10. FIG. 3B is a top view of the package structure 10.

As shown in FIGS. 3A and 3B, the package structure 10 includes a leadframe 12, a gallium nitride (GaN) power device 14 and an electrostatic discharge protection component 16. The leadframe 12 includes a gate pad 12a, a source pad 12b, a drain pad 12c and a Kelvin source pad 12d disposed on it. The GaN power device 14 has a gate end 14a, a first source end 14b, a second source end 14c and a drain end 14d. The GaN power device 14 is disposed on the source pad 12b of the leadframe 12. The electrostatic discharge protection component 16 includes a first pad 16a and a second pad 16b disposed on it. The first pad 16a and the second pad 16b are disposed on the same surface of the electrostatic discharge protection component 16. The electrostatic discharge protection component 16 is disposed on the source pad 12b of the leadframe 12. The first source end 14b of the GaN power device 14 is electrically connected to the Kelvin source pad 12d of the leadframe 12. The second source end 14c of the GaN power device 14 is electrically connected to the source pad 12b of the leadframe 12. The drain end 14d of the GaN power device 14 is electrically connected to the drain pad 12c of the leadframe 12. Specifically, the gate end 14a of the GaN power device 14 is electrically connected to the first pad 16a of the electrostatic discharge protection component 16. The first pad 16a of the electrostatic discharge protection component 16 is electrically connected to the gate pad 12a of the leadframe 12. The second pad 16b of the electrostatic discharge protection component 16 is electrically connected to the source pad 12b of the leadframe 12. In FIGS. 3A and 3B, for example, the first source end 14b of the GaN power device 14 is electrically connected to the Kelvin source pad 12d of the leadframe 12 by a conductive wire 18a. The second source end 14c of the GaN power device 14 is electrically connected to the source pad 12h of the leadframe 12 by a conductive wire 18b. The drain end 14d of the GaN power device 14 is electrically connected to the drain pad 12c of the leadframe 12 by a conductive wire 18c. The gate end 14a of the GaN power device 14 is electrically connected to the first pad 16a of the electrostatic discharge protection component 16 by a conductive wire 18d. The first pad 16a of the electrostatic discharge protection component 16 is electrically connected to the gate pad 12a of the leadframe 12 by a conductive wire 18e. The second pad 16b of the electrostatic discharge protection component 16 is electrically connected to the source pad 12b of the leadframe 12 by a conductive wire 18g.

In some embodiments, the leadframe 12 is made of metal, such as copper or other appropriate metal materials. In some embodiments, the gate pad 12a, the source pad 12b, the drain pad 12c and the Kelvin source pad 12d are made of metal, such as silver or other appropriate metal materials.

In FIGS. 3A and 3B, the electrostatic discharge protection component 16 is a lateral component. In some embodiments, the capacitance value of the electrostatic discharge protection component 16 is greater than or equal to about 30 nC. In some embodiments, the operating voltage of the electrostatic discharge protection component 16 is greater than or equal to 6V. In some embodiments, the electrostatic discharge protection component 16 includes a Zener diode, or a transient voltage suppressor (TVS) diode.

Figure 4A:
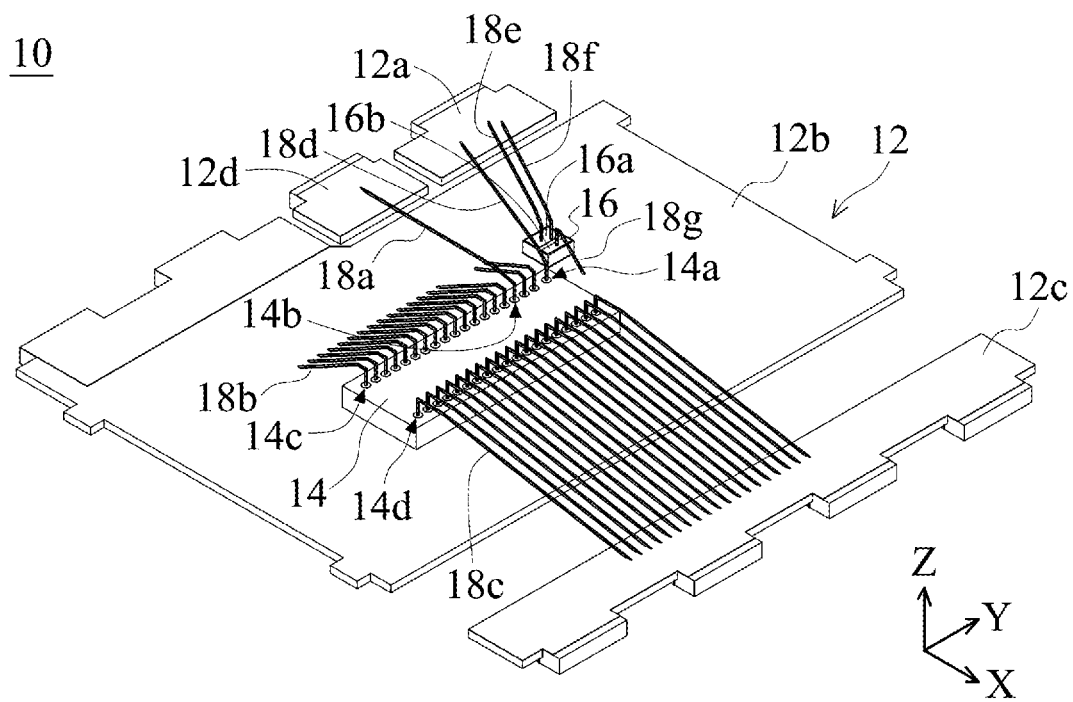
FIG. 4A is a stereoscopic view of a package structure in accordance with one embodiment of the present invention.
Figure 4B:
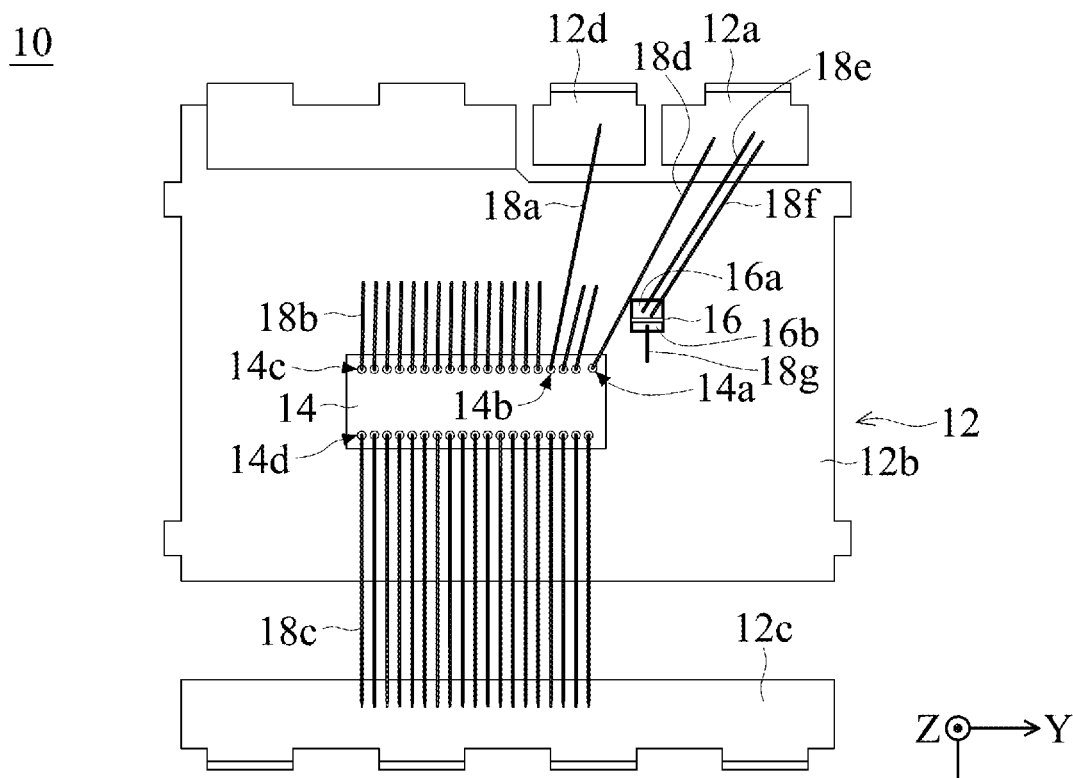
FIG. 4B is a top view of a package structure in accordance with one embodiment of the present invention.

Referring to FIGS. 4A and 4B, in accordance with one embodiment of the present invention, a package structure 10 is provided. FIG. 4A is a stereoscopic view of the package structure 10. FIG. 4B is a top view of the package structure 10.

As shown in FIGS. 4A and 4B, the package structure 10 includes a leadframe 12, a gallium nitride (GaN) power device 14, and an electrostatic discharge protection component 16. The leadframe 12 includes a gate pad 12a, a source pad 12b, a drain pad 12c, and a Kelvin source pad 12d disposed on it. The GaN power device 14 has a gate end 14a, a first source end 14b, a second source end 14c, and a drain end 14d. The GaN power device 14 is disposed on the source pad 12b of the leadframe 12. The electrostatic discharge protection component 16 includes a first pad 16a and a second pad 16b disposed on it. The first pad 16a and the second pad 16b are disposed on the same surface of the electrostatic discharge protection component 16. The electrostatic discharge protection component 16 is disposed on the source pad 12b of the leadframe 12. The first source end 14b of the GaN power device 14 is electrically connected to the Kelvin source pad 12d of the leadframe 12. The second source end 14c of the GaN power device 14 is electrically connected to the source pad 12b of the leadframe 12. The drain end 14d of the GaN power device 14 is electrically connected to the drain pad 12c of the leadframe 12. Specifically, the gate end 14a of the GaN power device 14 is electrically connected to the gate pad 12a of the leadframe 12. The first pad 16a of the electrostatic discharge protection component 16 is electrically connected to the gate pad 12a of the leadframe 12 by a plurality of conductive wires. The second pad 16b of the electrostatic discharge protection component 16 is electrically connected to the source pad 12b of the leadframe 12. In FIGS. 4A and 4B, for example, the first source end 14b of the GaN power device 14 is electrically connected to the Kelvin source pad 12d of the leadframe 12 by a conductive wire 18a. The second source end 14c of the GaN power device 14 is electrically connected to the source pad 12b of the leadframe 12 by a conductive wire 18b. The drain end 14d of the GaN power device 14 is electrically connected to the drain pad 12c of the leadframe 12 by a conductive wire 18c. The gate end 14a of the GaN power device 14 is electrically connected to the gate pad 12a of the leadframe 12 by a conductive wire 18d. The first pad 16a of the electrostatic discharge protection component 16 is electrically connected to the gate pad 12a of the leadframe 12 by two conductive wires (18e and 18f). In some embodiments, the first pad 16a of the electrostatic discharge protection component 16 is electrically connected to the gate pad 12a of the leadframe 12 by other appropriate number of conductive wires, for example, three or more. The second pad 16b of the electrostatic discharge protection component 16 is electrically connected to the source pad 12b of the leadframe 12 by a conductive wire 18g.

In some embodiments, the leadframe 12 is made of metal, such as copper or other appropriate metal materials. In some embodiments, the gate pad 12a, the source pad 12b, the drain pad 12c and the Kelvin source pad 12d are made of metal, such as silver or other appropriate metal materials.

In some embodiments, the GaN power device 14 includes, for example, GaN high-power devices.

In FIGS. 4A and 4B, the electrostatic discharge protection component 16 is a lateral component. In some embodiments, the capacitance value of the electrostatic discharge protection component 16 is greater than or equal to about 30 nC. In some embodiments, the operating voltage of the electrostatic discharge protection component 16 is greater than about 6V. In some embodiments, the electrostatic discharge protection component 16 includes a Zener diode, a transient voltage suppressor (TVS) diode, or a metal oxide varistor (MOV).

Comparative Example 1

Simulation of High-Frequency Oscillation Behavior in Package Structure

Figure 5A:
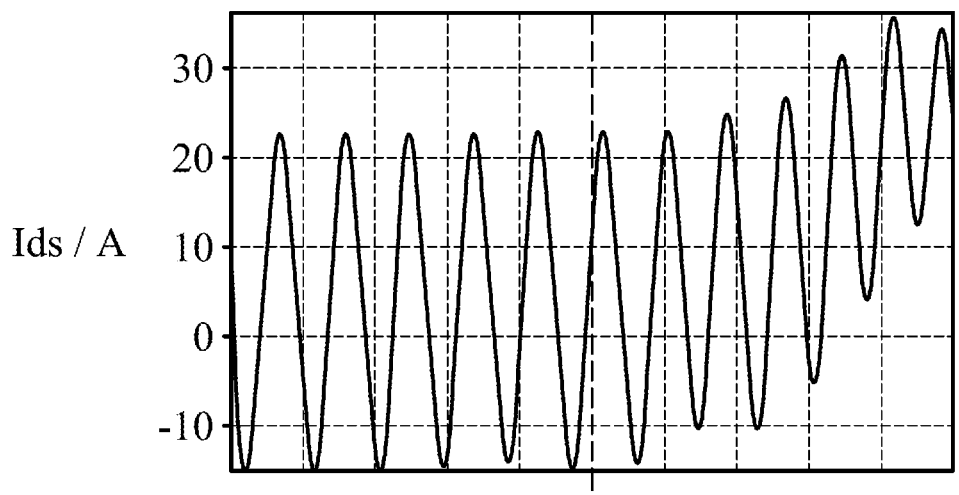
FIG. 5A shows a high-frequency oscillation behavior in a package structure in accordance with one comparative embodiment of the present invention.
Figure 5B:
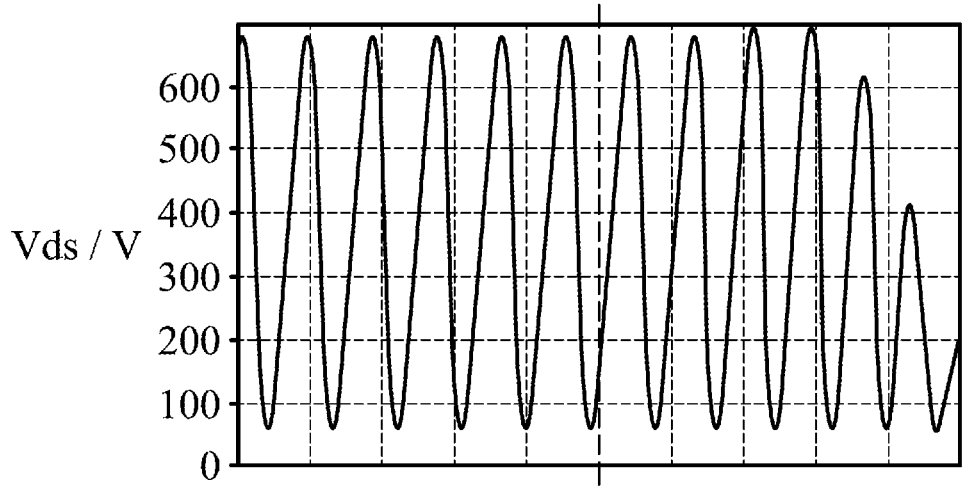
FIG. 5B shows a high-frequency oscillation behavior in a package structure in accordance with one comparative embodiment of the present invention.
Figure 5C:
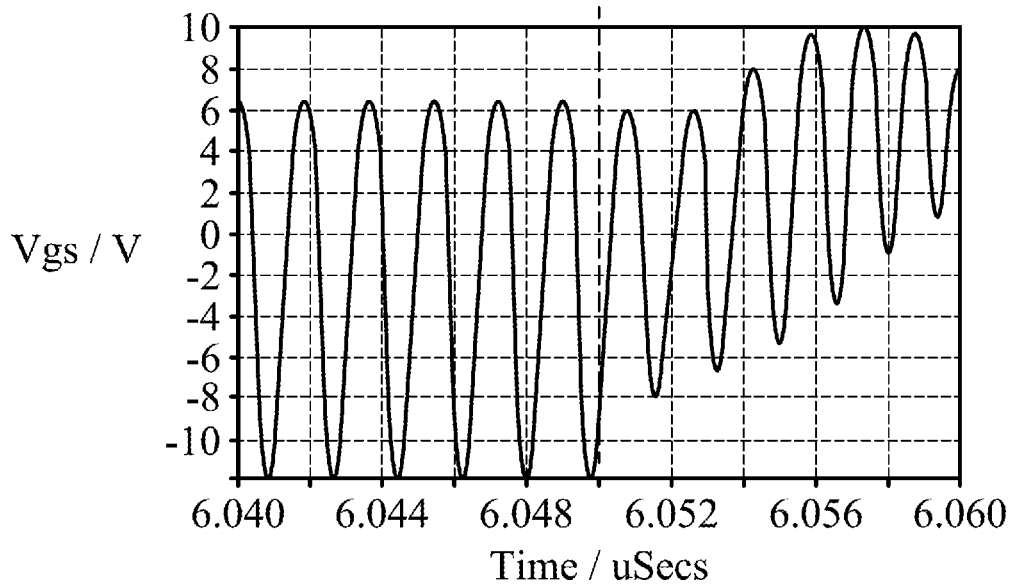
FIG. 5C shows a high-frequency oscillation behavior in a package structure in accordance with one comparative embodiment of the present invention.

In this comparative example, the package structure used for simulation is similar to that disclosed by FIG. 2A. The distinction between the two is that, in this comparative example, the first pad of the electrostatic discharge protection component is electrically connected to the gate pad of the leadframe by a single conductive wire (not shown). The simulation results are shown in FIGS. 5A-5C. FIG. 5A is the oscillation waveform of drain-source current (Ids). FIG. 5B is the oscillation waveform of drain-source voltage (Vds). FIG. 5C is the oscillation waveform of gate-source voltage (Vgs). In FIGS. 5A-5C, the left side of the dotted line is the waveform profile when the GaN power device is turned off. The right side of the dotted line is the waveform profile when the GaN power device is turned on.

In FIGS. 5A-5C, whether the GaN power device is turned off or turned on, Ids, Vds and Vgs have obvious high-frequency oscillations.

Example 1

Simulation of High-Frequency Oscillation Behavior in Package Structure

Figure 6A:
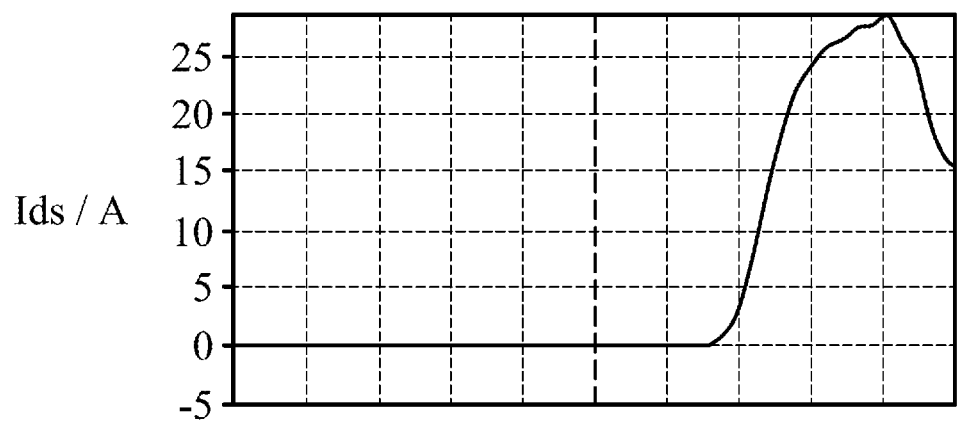
FIG. 6A shows a high-frequency oscillation behavior in a package structure in accordance with one embodiment of the present invention.
Figure 6B:
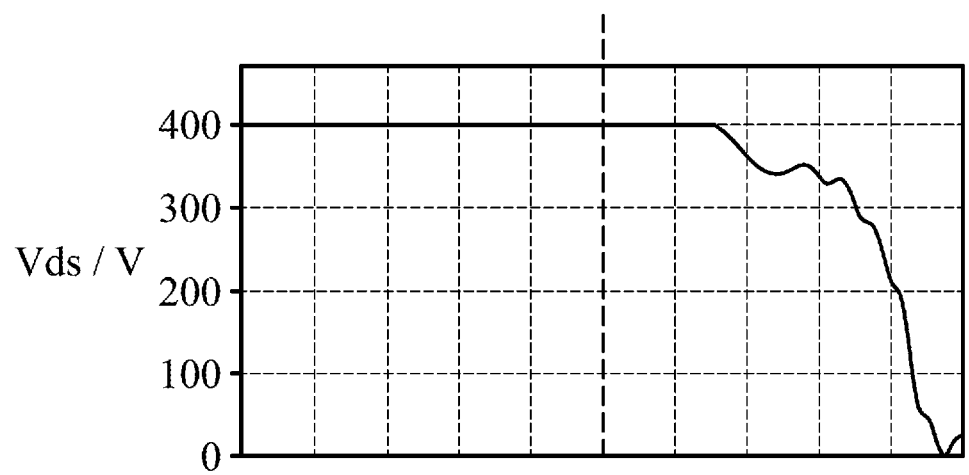
FIG. 6B shows a high-frequency oscillation behavior in a package structure in accordance with one embodiment of the present invention.
Figure 6C:
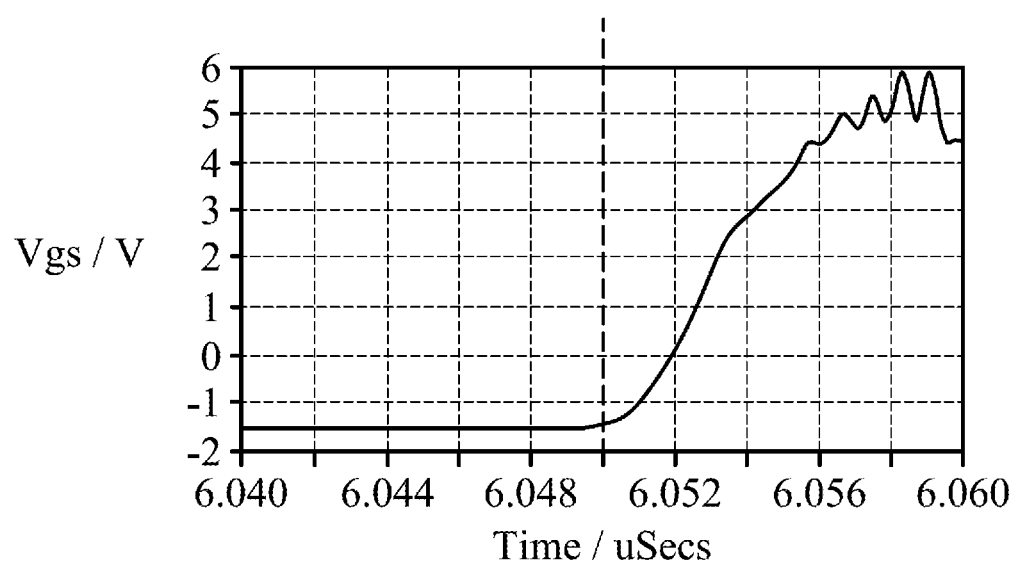
FIG. 6C shows a high-frequency oscillation behavior in a package structure in accordance with one embodiment of the present invention.

In this example, the package structure used for simulation is shown in FIG. 1A. That is, the gate end 14a of the GaN power device 14 is electrically connected to the first pad 16a of the electrostatic discharge protection component 16 by the conductive wire 18d. The first pad 16a of the electrostatic discharge protection component 16 is electrically connected to the gate pad 12a of the leadframe 12 by the conductive wire 18e. The simulation results are shown in FIGS. 6A-6C. FIG. 6A is the oscillation waveform of drain-source current (Ids). FIG. 6B is the oscillation waveform of drain-source voltage (Vds). FIG. 6C is the oscillation waveform of gate-source voltage (Vgs). In FIGS. 6A-6C, the left side of the dotted line is the waveform profile when the GaN power device is turned off. The right side of the dotted line is the waveform profile when the GaN power device is turned on.

In FIGS. 6A-6C, whether the GaN power device is turned off or turned on, no high-frequency oscillation in Ids, Vds and Vgs.

Example 2

Simulation of High-Frequency Oscillation Behavior in Package Structure

Figure 7A:
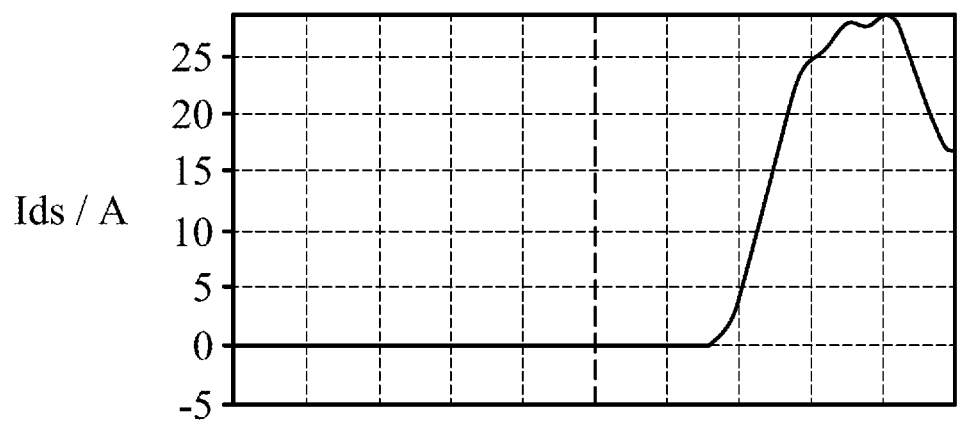
FIG. 7A shows a high-frequency oscillation behavior in a package structure in accordance with one embodiment of the present invention.
Figure 7B:
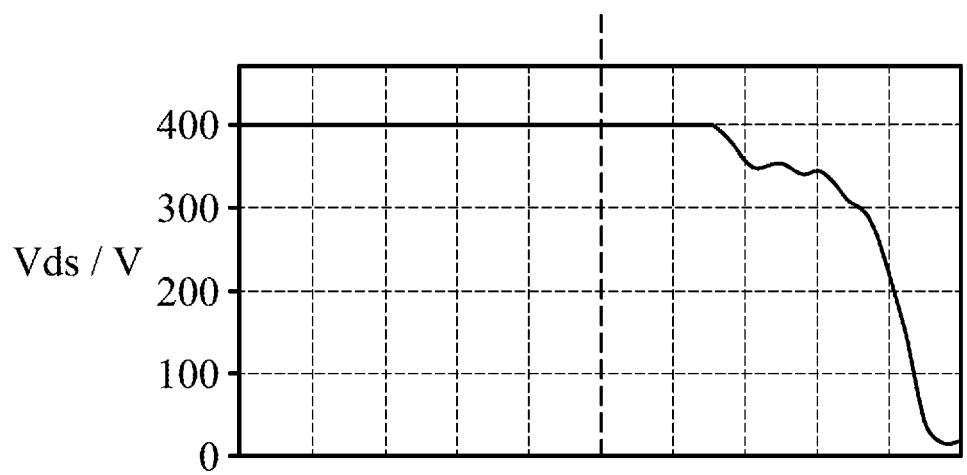
FIG. 7B shows a high-frequency oscillation behavior in a package structure in accordance with one embodiment of the present invention.
Figure 7C:
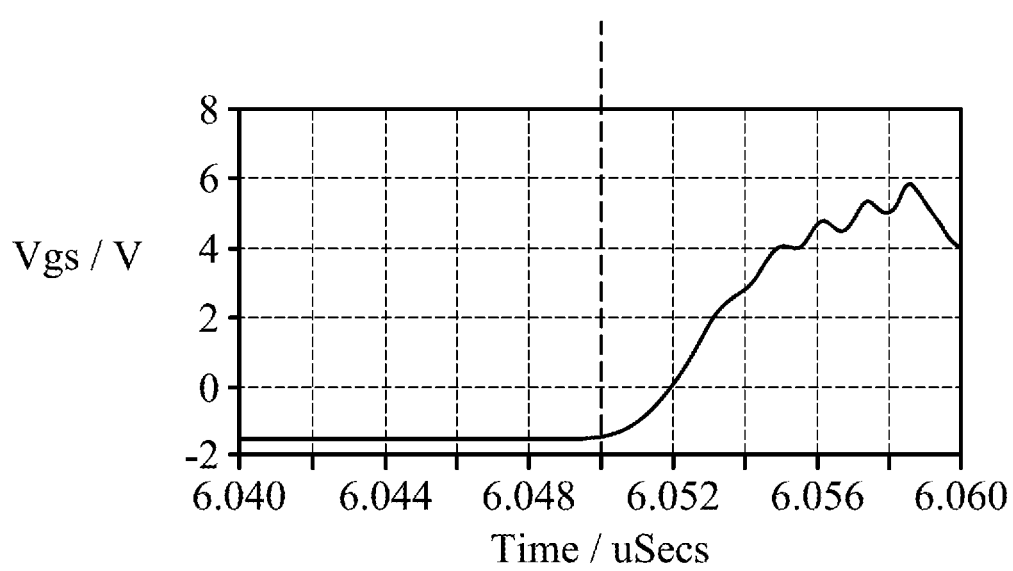
FIG. 7C shows a high-frequency oscillation behavior in a package structure in accordance with one embodiment of the present invention.

In this example, the package structure used for simulation is shown in FIG. 2A. That is, the gate end 14a of the GaN power device 14 is electrically connected to the gate pad 12a of the leadframe 12 by the conductive wire 18d. The first pad 16a of the electrostatic discharge protection component 16 is electrically connected to the gate pad 12a of the leadframe 12 by the two conductive wires (18e and 18f). The simulation results are shown in FIGS. 7A-7C. FIG. 7A is the oscillation waveform of drain-source current (Ids). FIG. 7B is the oscillation waveform of drain-source voltage (Vds). FIG. 7C is the oscillation waveform of gate-source voltage (Vgs). In FIGS. 7A-7C, the left side of the dotted line is the waveform profile when the GaN power device is turned off. The right side of the dotted line is the waveform profile when the GaN power device is turned on.

In FIGS. 7A-7C, whether the GaN power device is turned off or turned on, no high-frequency oscillation in Ids, Vds and Vgs.

In the present invention, the connection manner for the wire-bonding from the gate end of the GaN power device to the electrostatic discharge protection component and from the electrostatic discharge protection component to the gate pad of the leadframe can greatly reduce the inductance in the wire-bonding loop and suppress the high-frequency oscillation of the system. Also, in another connection manner, for example, the wire-bonding from the gate end of the GaN power device to the gate pad of the leadframe and from the electrostatic discharge protection component to the gate pad of the leadframe by a plurality of conductive wires, which can effectively reduce the parasitic inductance caused by the wire-bonding by 20-40% and suppress the high-frequency oscillation of the system. Therefore, the disclosed package structure with the electrostatic discharge protection component in the specific connection manners can not only greatly reduce parasitic inductance, but also resist electrostatic discharge (ESD) pulse, so that the electronic device can operate normally, and its reliability can be improved.

While the invention has been described by way of example and in terms of embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A package structure, comprising:
  a leadframe comprising a gate pad, a source pad, a drain pad and a kelvin source pad, which are disposed on the leadframe:

a GaN power device having a gate end, a first source end, a second source end and a drain end, wherein the GaN power device is disposed on the source pad of the leadframe;

an electrostatic discharge protection component comprising a first pad, wherein the electrostatic discharge protection component is disposed on the source pad of the leadframe, the gate end of the GaN power device is electrically connected to the first pad of the electrostatic discharge protection component by a first conductive wire, and the first pad of the electrostatic discharge protection component is electrically connected to the gate pad of the leadframe by a second conductive wire, the first source end of the GaN power device is electrically connected to the kelvin source pad of the leadframe by a third conductive wire, the second source end of the GaN power device is electrically connected to the source pad of the leadframe by a fourth conductive wire and the drain end of the GaN power device is electrically connected to the drain pad of the leadframe by a fifth conductive wire.

2. The package structure as claimed in claim 1, wherein the electrostatic discharge protection component further comprises a second pad, and the first pad and the second pad are disposed on the same surface of the electrostatic discharge protection component.

3. The package structure as claimed in claim 2, wherein the second pad of the electrostatic discharge protection component is electrically connected to the source pad of the leadframe by a sixth conductive wire.

4. The package structure as claimed in claim 1, wherein the electrostatic discharge protection component has a capacitance value that is greater than or equal to 30 nC.

5. The package structure as claimed in claim 4, wherein the electrostatic discharge protection component has an operating voltage that is greater than or equal to 6V.

6. The package structure as claimed in claim 1, wherein the electrostatic discharge protection component comprises a Zener diode, or a transient voltage suppressor (TVS) diode.

* * * * *